United States Patent [19]
Birdsall et al.

[11] Patent Number: 6,028,459
[45] Date of Patent: Feb. 22, 2000

[54] TRACK AND HOLD CIRCUIT WITH CLAMP

[75] Inventors: Dwight Birdsall; Ajay Kuckreja; Phillip Elliott, all of Fort Collins, Colo.

[73] Assignee: National Semiconductor Corporation, Santa Clara, Calif.

[21] Appl. No.: 09/063,104

[22] Filed: Apr. 20, 1998

[51] Int. Cl.[7] .................................................. G11C 27/02
[52] U.S. Cl. ................................................ 327/94; 327/96
[58] Field of Search ................................. 327/91, 93–96, 327/309, 312, 321, 333; 341/122

[56] References Cited

U.S. PATENT DOCUMENTS

| | | | |
|---|---|---|---|
| 4,886,986 | 12/1989 | Watanabe | 327/94 |
| 5,298,801 | 3/1994 | Vorenkamp et al. | 307/353 |
| 5,457,418 | 10/1995 | Chang | 327/374 |
| 5,517,141 | 5/1996 | Abdi et al. | 327/96 |
| 5,583,459 | 12/1996 | Sone | 327/95 |
| 5,734,276 | 3/1998 | Abdi et al. | 327/94 |
| 5,838,175 | 11/1998 | Hsieh | 327/94 |

OTHER PUBLICATIONS

Razavi, Behzad, Design of a 100–Mhz 10–Mw 3–V Sample-–and–Hold Amplifier in Digital Bipolar Technololgy, IEEE Journal of Solid–State Circuits, vol. 30, No. 7, Jul. 1995, pp. 724–730.

Vorenkamp et al., Fully Bipolar, 120–Msample/s 10–b Track–and–Hold Circuit, IEEE Journal of Solid–State Circuits, vol. 27, No. 7, Jul. 1992, pp. 988–992.

Vorenkamp et al., A 12b 50MSample/s Cascaded Folding and Interpolating ADC, Phillips Composants et Semiconducteurs, Caen, France, 1997 IEEE International Solid–State Circuits Conference (ISSCC97), Session 8/Data Converters/Paper FA 8.2, Feb. 7, 1997.

*Primary Examiner*—My-Trang Nuton
*Attorney, Agent, or Firm*—Limbach & Limbach L.L.P.

[57] ABSTRACT

A track-and-hold amplifier circuit capable of increasing hold mode isolation includes an input circuit to buffer an input signal coupled to a switching transistor. A clamping transistor couples to the base of the switching transistor, and a hold capacitor couples between the emitter of the switching transistor and circuit ground. A differential amplifier circuit has a first input for receiving a track signal and a second input for receiving a hold signal. When the differential amplifier circuit receives the track signal, the switching circuit closes to charge the hold capacitor. When the differential amplifier receives the hold signal, the switching transistor opens to store the voltage representative of the input signal on the hold capacitor and the clamping transistor clamps the voltage at the base of the switching transistor. Thus, the base emitter voltage of the switching transistor is zero volts, and the signal held by the hold capacitor is independent of the input signal. In addition, by using level shifters, the voltage clamped at the base of the switching transistor is substantially equal to the voltage held on the hold capacitor.

17 Claims, 3 Drawing Sheets

TRACK AND HOLD CIRCUIT WITH CLAMP

BACKGROUND OF THE INVENTION

1. Field of the Invention

The present invention relates to technologies for sampling analog signals and, in particular, to a track and hold circuit.

2. Related Art

The principle underlying digital signal processing is that of sampling the analog signal. A typical situation in which this occurs is in connection with providing digital representations of amplitude values of an analog voltage signal, i.e., analog-to-digital conversion.

For such conversions, a succession of amplitude values of a varying analog signal is selected for conversion to digital representations, each such amplitude value being acquired after a selected interval has elapsed since the preceding acquisition. Often, the best conversion result can be provided if the input signal to the converter maintains a substantially constant value at the input to the analog-to-digital converter during the conversion process.

One type of circuit for providing for a selected duration of time, a substantially constant value for each of the selected analog values is a track-and-hold amplifier. High-speed track-and-hold amplifiers in npn bipolar technologies have achieved very high sampling rates.

One technique using bipolar devices in a high-speed track-and-hold amplifier is explained in *Design of a 100-MHz 10-mW 3-V Sample-and Hold Amplifier in Digital Bipolar Technology*, IEEE Journal of Solid-State Circuits, Vol. 30, No. 7, July 1983, pp. 724–730, and U.S. Pat. No. 5,298,801, which are incorporated herein by reference. This article and patent disclose a low-voltage open-loop track-and-hold amplifier circuit using all-npn digital bipolar technologies. This track-and-hold amplifier is illustrated in FIG. 1.

The track-and-hold amplifier circuit 100 is a differential circuit in which a differential switching stage SS is coupled at one side to a differential input stage IS having input terminals 11, 21 for receiving a differential input signal Vin1–Vin2. At the other side, switching stage SS is coupled to a differential output stage OS having output terminals 12, 22 for supplying a differential output signal Vout1–Vout2. Differential switching stage SS comprises two similarly constructed sections. The first section of differential switching stage SS comprises a switching transistor Q5 having a base coupled to the input stage IS, a collector coupled to a voltage supply VCC, and an emitter coupled to output stage OS. In addition, the first section of differential switching stage SS comprises a differential amplifier Q8/Q7 which has a first input for receiving a hold signal CK' (CK bar), a second input for receiving a track signal CK, and a common terminal coupled to current source IF. In this way, differential amplifier Q8/Q7 couples current source IF to switching transistor Q5, and switches current from current source IF by the track and hold signals CK, CK'. When current from current source IF is switched through transistor Q7, then transistor Q5 is biased on and forms a simple emitter-follower between input stage IS and a hold capacitor $C_{H1}$, coupled between the emitter of switching transistor Q5 and circuit ground. This state is referred to as the track-mode as the output signal at hold capacitor $C_{H1}$ will track the input signal.

The second section of the differential switching stage SS comprises a switching transistor Q6 having a base coupled to the input stage IS, a collector coupled to the voltage supply VCC, and an emitter coupled to the output stage OS. In addition, the second section of the differential switching stage SS comprises a differential amplifier Q9/Q10 having a first input for receiving a hold signal CK', a second input for receiving a track signal CK and a common terminal coupled to circuit ground by means of current source IF. Differential amplifier also includes a first output coupled to the base of switching transistor Q6 and a second output coupled to the emitter of the switching transistor Q6. A hold capacitor $C_{H2}$ is coupled between the emitter of switching transistor Q6 and circuit ground.

Input stage IS comprises a degenerated differential amplifier Q1/Q2/R1/R2 to supply a signal to the bases of switching transistors Q5, Q6, which signal is related to differential input signal Vin1–Vin2 applied to the input terminals. Degenerated differential amplifier Q1/Q2/R1/R2 has first and second inputs respectively coupled to input terminals 11, 12 for receiving differential input signal Vin1–Vin2, a common terminal coupled to circuit ground by means of a current source IEE, and has first and second outputs coupled to the bases of the respective switching transistors Q5, Q6. The differential amplifier is constructed by means of two npn transistors Q1, Q2 and two emitter resistors R1, R2, and the respective load impedances each comprising resistors R3, R4 respectively arranged in series with diode-connected transistors Q3, Q4, respectively. Distortion introduced by differential amplifier Q1/Q2/R1/R2 is compensated for by the base-emitter junctions in unidirectional diode-coupled transistors Q3 and Q4. As a result of these diode-coupled transistors Q3 and Q4, input stage IS provides a substantially linear voltage-to-voltage conversion.

Track-and-hold amplifier circuit 100 operates as follows. Differential amplifier Q1/Q2/R1/R2 converts differential input signal Vin1–Vin2 applied to input stage IS into a differential voltage drive for switching stage SS.

The mode set by switching stage SS can be a tracking mode or a hold mode. In the track mode, switching transistors Q5, Q6 are in the conductive state as a result of the track signal CK applied to differential amplifiers Q8/Q7, Q9/Q10. In the hold mode, switching transistors Q5 and Q6 are in a cut-off mode as a result of the hold signal CK' applied to differential amplifiers Q8/Q7, Q9/Q1O. As a result of the state of switching transistors Q5, Q6, differential output signal Vout1–Vout2 in the tracking mode is dictated by the input signal. Output signal Vout1–Vout2 in the hold mode is equal to the voltage sampled onto hold capacitors $C_{H1}$, $C_{H2}$ at the sampling instant, when switching transistors Q5 and Q6 are turned off. In addition, output signal Vout1–Vout2 also includes some finite drooping of this held voltage due to leakage currents in off transistors Q5, Q7, Q6, Q10 and any hold amplifier circuitry which may follow the circuit illustrated in FIG. 1.

Although this track-and-hold amplifier circuit 100 has good switching speed, it has several disadvantages. In practice, when designed for 10-bit linearity, the track-and-hold circuit 100 only accommodates a 1 V differential input swing with a 5 V voltage supply. In addition, the track-and-hold circuit 100 has moderate distortion, much of which is in the amplifier stage. The circuit also suffers from lack of isolation between the signals of the input and the output stages because in the hold mode, input signal Vin1–Vin2 influences output signal Vout1–Vout2. This is referred to as hold-mode feedthrough. This is the feedthrough of the input signal to the hold capacitor $C_{H1}$, $C_{H2}$ during the hold mode, caused by a parasitic capacitance between the base and the emitter of switching transistors Q5, Q6.

There are various ways that the signal may be fed through to the output. However, the most concerning path is through the capacitance of the base emitter junction of switching transistors Q5, Q6 when these transistors Q5, Q6 are off. As a result, in the hold mode when transistor Q5 is off, for example, the transistor Q5 can be represented as its base-emitter junction capacitance $C_{je5}$. This results in a capacitive divider of the base-emitter capacitance $C_{je5}$ of transistor Q5 and hold capacitor $C_{H1}$, as illustrated in FIG. 2. However, even though switching transistor Q5 is off, there is still a portion of the input signal Vin1 at node N1. Now the switching on of transistor Q8 has lowered the dc level at the base at transistor Q5, but the impedance at the base of transistor Q5 is the same in the track or hold mode. Thus, the nominal signal amplitude is still present at the base of transistor Q5. As a result, track-and-hold amplifier circuit 100 has poor isolation when it is in the hold mode.

U.S. Pat. No. 5,298,801 discloses one method of reducing the problem of hold-mode feedthrough, which is illustrated in track-and-hold circuit 300 of FIG. 3. Hold-mode feedthrough can be substantially compensated for by providing the track-and-hold circuit with a first and a second feedforward capacitor $C_{F1}$ and $C_{F2}$, respectively. The first feedforward capacitor $C_{F1}$ is coupled between the emitter of one switching transistor Q5 and the base of the other switching transistor Q7. The second feedforward capacitor $C_{F2}$ is coupled between the emitter of the other switching transistor Q7 and the base of one switching transistor Q5. The hold-mode feedthrough caused by the parasitic capacitance is compensated for in that feedforward capacitors $C_{F1}$, $C_{F2}$ receive a drive opposite to the drive of the parasitic capacitance between the base and emitter of switching transistor Q5, Q7. The hold-mode feedthrough can be substantially compensated for when the feedforward capacitors are selected to be identical to the parasitic base-emitter capacitance of the switching transistors Q5, Q7.

One disadvantage to using such feedforward capacitors $C_{F1}$, $C_{F2}$, however, is that complementary signals Vin1, Vin2 must be available. Therefore, the configuration of track-and-hold circuit 300 is dependent upon having the signal at node N1 move in the exact opposite phase as the signal at node N2. Such complementary signals may not be available if input signals Vin1, Vin2 are provided by an external source or if to conserve power, only half of track-and-hold circuit 300 is constructed. In addition, at high frequencies the input signal may not be exactly complementary which can cause problem with track-and-hold circuit 300. Furthermore, track-and-hold circuit 300 also requires additional power and die space to operate both differential stages.

Therefore, a need exits for a track-and-hold circuit capable of minimizing hold-mode feedthrough without requiring complementary signals.

SUMMARY OF THE INVENTION

A track-and-hold circuit capable of increasing hold mode isolation includes an input circuit to buffer an input signal, coupled to a switching transistor. A clamping transistor couples to the base of the switching transistor, and a hold capacitor couples between the emitter of the switching transistor and circuit ground. A differential amplifier circuit has a first input for receiving a track signal and a second input for receiving a hold signal. When the differential amplifier circuit receives the track signal, the switching circuit closes to drive the hold capacitor voltage to follow the input voltage. When the differential amplifier receives the hold signal, the switching transistor opens to store the voltage representative of the input signal on the hold capacitor and the clamping transistor clamps the voltage at the base of the switching transistor. Thus, the base emitter voltage of the switching transistor is zero volts, and the signal held by the hold capacitor is independent of the input signal.

In a first embodiment, the input circuit of the track-and-hold amplifier circuit includes a buffer transistor and diodes to level shift the input signal. In addition, the track-and-hold circuit includes an output buffer transistor to buffer the voltage held on the hold capacitor from the output terminal, and diodes to level shift the voltage level held on the hold capacitor to restore the voltage offset by the input circuit. By using these level shifting diodes, the voltage clamped at the base of the switching transistor is substantially equal to the voltage held on the hold capacitor.

In a second embodiment, the input circuit of the track-and-hold amplifier circuit encloses elements of the sampler within a feedback loop and uses negative feedback to reduce the noise and distortion errors. In addition, two switching transistors are used in place of the single switching transistor of the first embodiment. Enclosing one of the switching transistors inside of the feedback loop of the amplifier, reduces distortion caused by the change in base current of that particular switching transistor due to the charge and discharge current flowing through the hold capacitor. Since the two switching transistors are in parallel, the feedback loop also reduces the errors of the other switching transistor as well.

Both embodiments of the track-and hold circuit include the clamping transistor. By clamping the voltage at the base of the switching transistor when the track-and-hold circuit transitions from the track mode to the hold mode, the signal dependence of the hold pedestal is greatly reduced, as well as hold-mode feedthrough.

These and other features and advantages of the present invention will be understood upon consideration of the following detailed description of the invention and the accompanying drawings.

BRIEF DESCRIPTION OF THE DRAWINGS

Like reference symbols are employed in the drawings and in the description of the preferred embodiment to represent the same or similar items.

DETAILED DESCRIPTION OF THE PREFERRED EMBODIMENT

Figure 4:
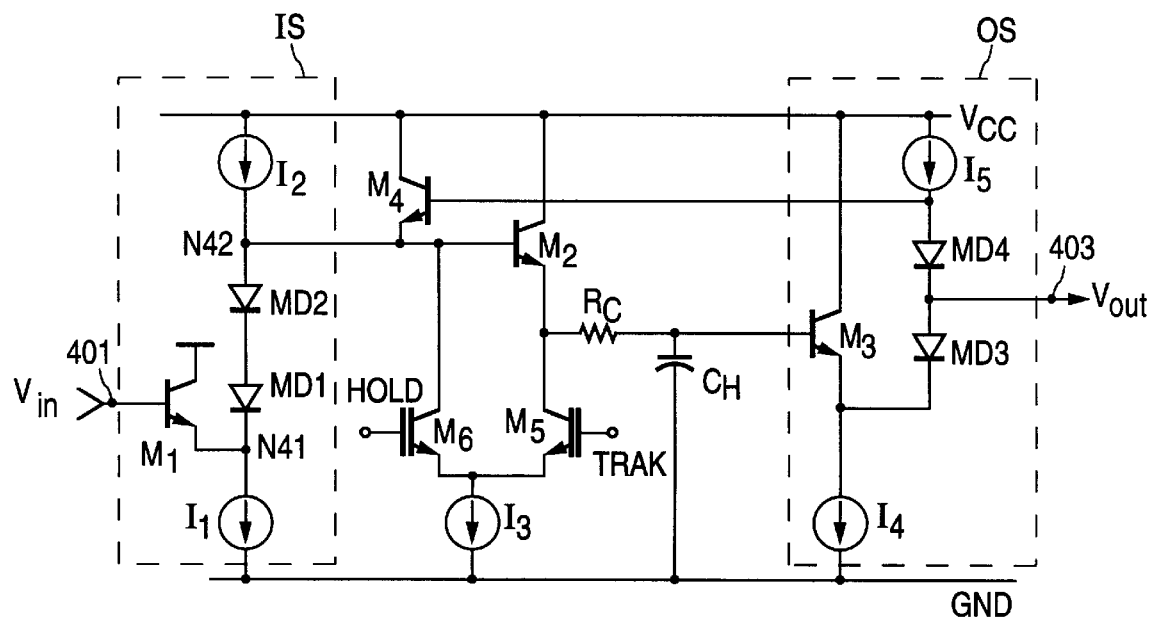
FIG. 4 illustrates an embodiment of a track-and-hold circuit in accordance with the present invention.

FIG. 4 illustrates a schematic diagram of track-and-hold circuit 400, in accordance with a first embodiment of the present invention. The invention relates to a track-and-hold circuit 400 in which a switching circuit couples to a input circuit for receiving an input signal Vin and couples to an output circuit for supplying an output signal Vout. It will be appreciated that although track-and-hold amplifier circuit 400 is illustrated as a singe-ended circuit, it can also be configured as a differential circuit with two trac-and-hold circuits 400 to process differential signals. In addition, it will be appreciated that although track-and-hold circuit 400 is illustrated as comprising npn bipolar transistors, other transistors such as pnp, complementary metal oxide semiconductor (CMOS), n-channel metal oxide semiconductor (NMOS) or p-channel NMOS metal oxide semiconductor (PMOS) may be used.

Figure 1:
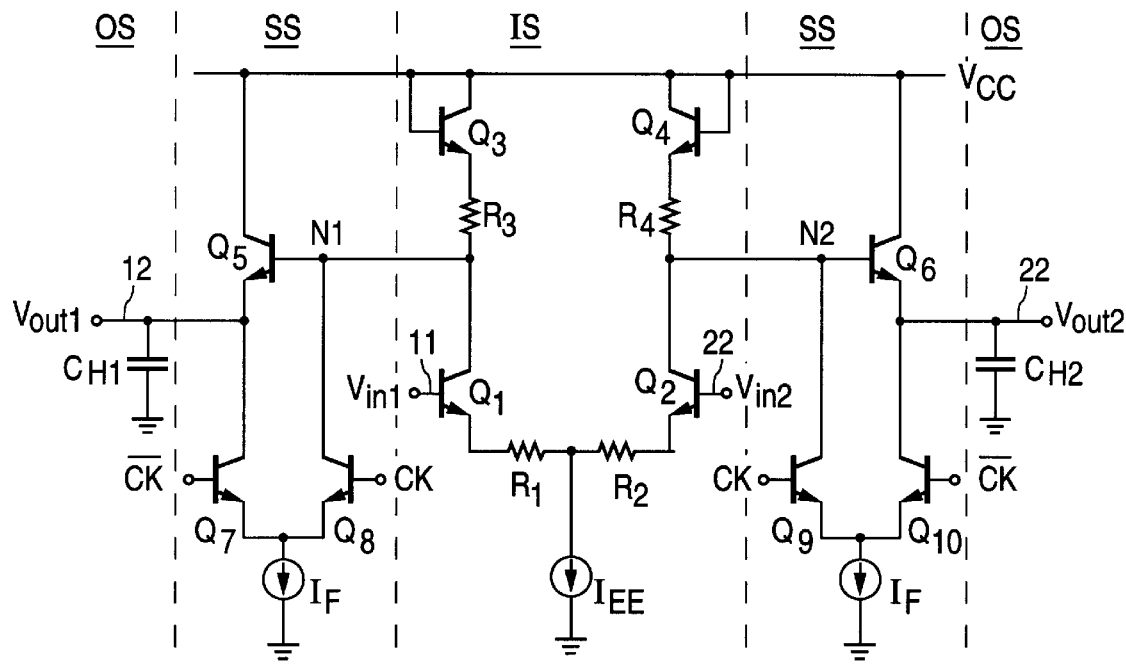
FIG. 1 illustrates a conventional track-and-hold amplifier circuit.
Figure 2:
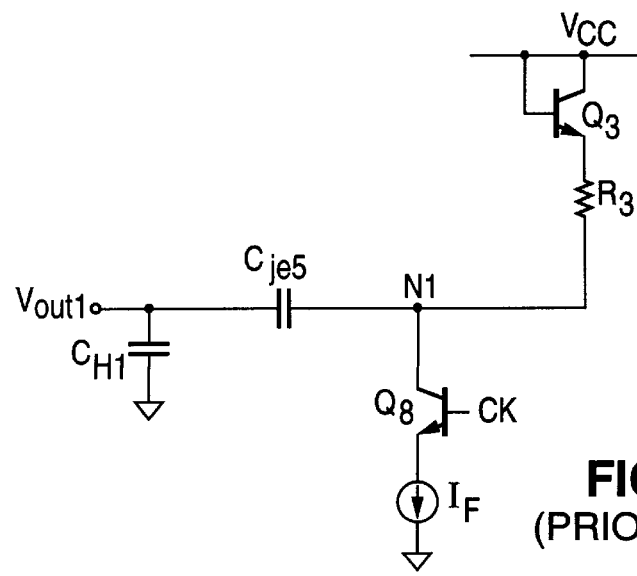
FIG. 2 illustrates a capacitive divider of the conventional track-and-hold amplifier circuit during hold-mode feedthrough.
Figure 3:
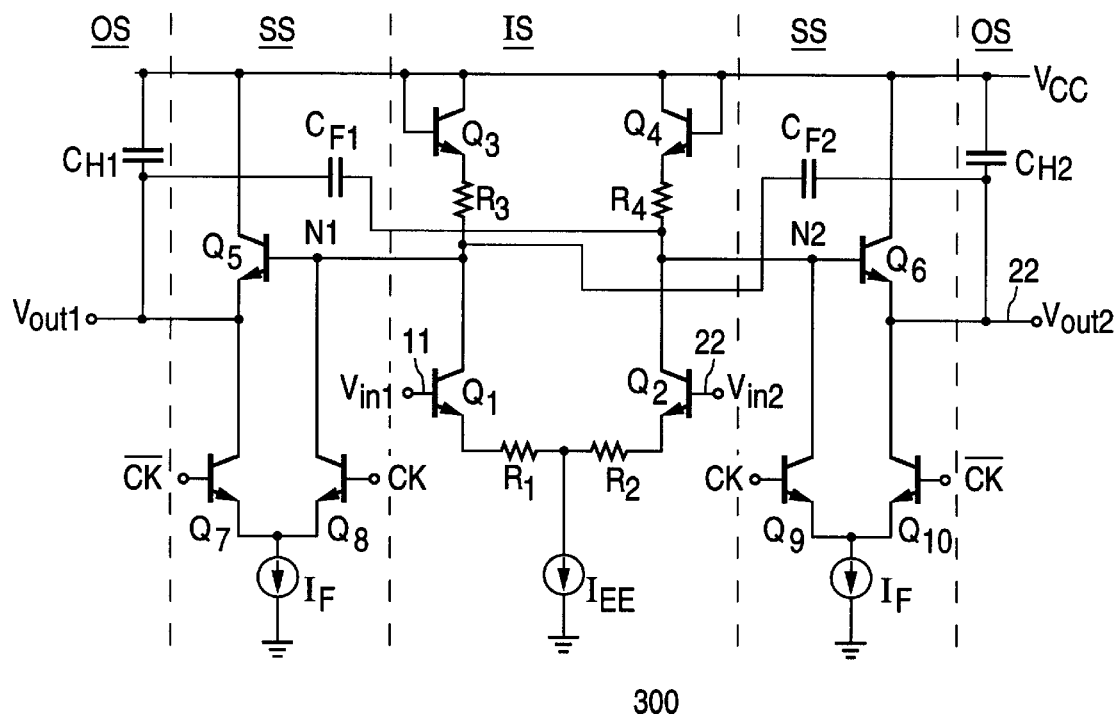
FIG. 3 illustrates another conventional track-and-hold amplifier circuit.

Track-and-hold amplifier circuit 400 includes a switching transistor M2 having a base coupled to an input circuit IS and a collector coupled to voltage supply VCC. Track-and-hold circuit 400 also includes a differential amplifier M5/M6 having inputs for receiving a hold signal HOLD and a track signal TRACK, and having a first output coupled to the base of switching transistor M2, and a second output coupled to the emitter of the switching transistor M2. As shown in FIG. 2, the hold signal HOLD is applied to the base of transistor M6 and the track signal TRACK is applied to the base of transistor M5. Current source I3 is connected between the emitters of transistors M5, M6 and circuit ground.

A hold capacitor $C_H$ is coupled between circuit ground and the emitter of switching transistor M2 by means of a resistor Rc. The resistor Rc is used to optimize noise and distortions.

Track-and-hold circuit 400 further includes a clamping transistor M4 having a collector coupled to voltage supply VCC, and an emitter coupled to the base of the switching transistor M2. A bias current is applied from current source I5 to the base of clamping transistor M4.

Input circuit IS operates to achieve switch buffering and includes transistor M1, current source I1, current source I2, and diodes MD1, MD2. Transistor M1 operates as a buffer transistor and has a collector coupled to voltage supply VCC and a base coupled to input terminal 401 for receiving input voltage signal Vin. A bias current is applied to the emitter of buffer transistor M1 from current source I1. Diodes MD1, MD2 perform level shifting resulting in the dc voltage at node N42 being higher than voltage level at node N41, which is the emitter voltage of buffer transistor M1. A bias current is applied to diodes MD1, MD2 from current source I2 which biases the diodes MD1, MD2 on. Typically, current source I3 is substantially greater than current source I2. For example, in one embodiment current source I3 is approximately three times larger than current source I2. In addition, typically current source I1 is approximately twice as large as current source I2, and should be greater than current source I2 for proper circuit operation.

Output circuit OS comprises transistor M3 and diodes MD3 and MD4 which together buffer the signal held on hold capacitor $C_H$ and level shift the signal up to output terminal 403. Since hold capacitor $C_H$ has a relatively high input impedance, transistor M3 operates as a hold amplifier to buffer the voltage stored on hold capacitor $C_H$. A bias current is applied from current source I4 to the emitter of transistor M3 to bias the hold amplifier on. Diodes MD3 and MD4 perform level shifting to provide at output terminal 403 hold voltage $V_{HOLD}$, the voltage that is held on hold capacitor $C_H$, and to provide a bias voltage for transistor M4 when in the hold mode. A bias current is applied to diodes MD3, MD4 from current source I5 to bias these diodes MD3, MD4 on.

The track-and-hold circuit 400 operates in a track mode and a hold mode. In the track mode, transistor M1 has an emitter current equal to the current from current source I1 less the current from current source I2. In the hold mode, transistor M1 has an emitter current equal to the current from current source I1. The track signal TRACK and the hold signal HOLD are complementary so transistors M5, M6 alternately conduct. During the track mode, transistor M5 turns on, as a result of the track signal TRACK being applied to its base. When current from current source I3 is directed through transistor M5, switching transistor M2 is on, and therefore the switch is closed.

In this track mode, the track-and-hold amplifier circuit 400 is a string of emitter followers with diode level shifts MD1–MD3 used to maintain signal offset. In particular, diode level shifts MD1–MD3 are used to shift input signal Vin up to cancel the downward base-emitter voltage shifts of transistors M1–M3. Output signal Vout tracks the input signal Vin and clamping transistor M4 is biased off. Diode level shifts MD2 and MD4 create a bias of base-emitter voltage above the input signal Vin for the emitter and base of clamp transistor M4, respectively. Hold amplifier transistor M3 is biased on to secure the settling performance of the output buffer.

When the track-and-hold circuit 400 is switched from the track mode to the hold mode, the current from current source I3 is directed through transistor M6 rather than transistor M5. During the hold mode, switching transistor M2 is open, and therefore cut-off, as a result of hold signal HOLD being applied to the base of transistor M6 of differential amplifier M5/M6. As a result, the current goes into clamping transistor M4. Therefore, when switching transistor M2 is cut-off, the input signal level is held on capacitor $C_H$ and clamping transistor M4 clamps the voltage at the base of switching transistor M2. In addition, in this hold-mode, hold amplifier transistor M3 is always biased on due to the bias current from constant current source I4.

The emitter of switching transistor M2 is at hold voltage $V_{HOLD}$, the voltage held on hold capacitor $C_H$. The emitter of buffer transistor M3 is equal to the hold voltage $V_{HOLD}$ less the base-emitter voltage VBE of transistor M3. Therefore output voltage Vout is equal to:

$$Vout = V_{HOLD} - V_{BE(M3)} + V_{BE(MD3)}$$

Where $V_{BE(M3)}$ is the base-emitter voltage of transistor M3 and $V_{BE(MD3)}$ is the base-emitter voltage of diode MD3. The voltage at the base of transistor M4 is then equal to:

$$V_{BM4} = V_{HOLD} + V_{BE(MD4)}$$

Where $V_{BM4}$ is the voltage at the base of transistor M4 and $V_{BE(MD4)}$ is the base-emitter voltage of diode MD4. The voltage at the emitter of transistor M4 is then equal to:

$$V_{EM4} = V_{HOLD} + V_{BE(MD4)} - V_{BE(M4)} = V_{HOLD}$$

As illustrated in FIG. 4, the base of switching transistor M2 is at the same potential as $V_{EM4}$ which is hold voltage $V_{HOLD}$. Therefore, the emitter and base of transistor M2 are at the same potential, hold voltage $V_{HOLD}$, so transistor M2 is off.

The difference between track-and-hold circuit 400 and conventional prior art track-and-hold circuit 200 is that in the hold mode there is a very low impedance at the base of switching transistor M2 of track-and-hold circuit 400. In track-and-hold circuit 400 there is also additional isolation due to diodes MD1–MD2. When the voltage at node N42 drops, these diodes MD1–MD2 turn off and current from current source I2 flows through transistor M6. Therefore, the path that input signal Vin must follow to induce feedthrough into hold capacitor $C_H$ is through diodes MD1–MD2 and switching transistor M2. Since diodes MD1–MD2 are essentially off, they provide a very high impedance compared to the impedance of transistor M4 when this transistor M4 is on. Thus, input signal Vin is severely attenuated before reaching the base of transistor M2. As a result of this attenuation, track-and-hold circuit 400 improves hold mode feedthrough. For example, in practice, a 50 MHz analog input signal attenuation is more than approximately 80 dB at the base of switching transistor M2.

Track-and-hold amplifier circuit 400 is fast enough to be used for 8 and 10 bit analog-to-digital converter (ADC) systems, however track-and-hold circuit 400 has several disadvantages. First, transistors M1, MD1, MD2 and M2 all need to match for dc accuracy. Second, the noise and distortion, including both dc errors as well as dynamic error, needs improvement to meet the requirements of ADC systems involving more than 10 bits. Enclosing elements of the sampler within a feedback loop and using negative feedback to reduce the noise and distortion errors can attain these improvements.

Figure 5:
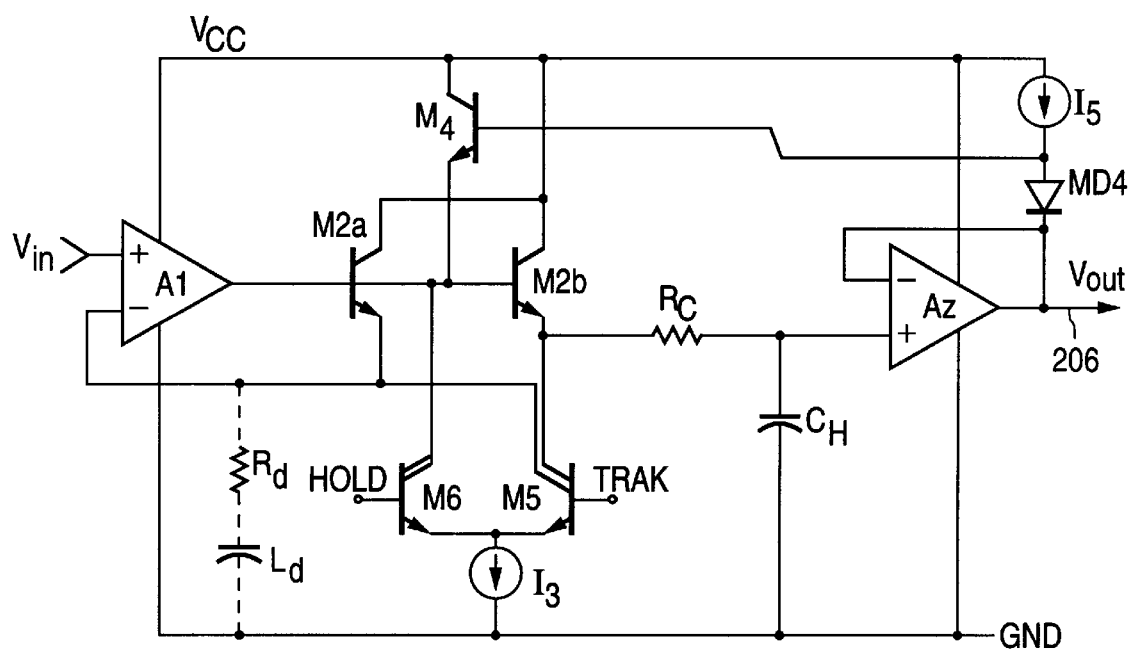
FIG. 5 illustrates another embodiment of a track-and-hold circuit in accordance with the present invention.

FIG. 5 illustrates an alternate embodiment of the present invention that addresses such improvement. As shown in this figure, a schematic diagram of track-and-hold circuit 500, includes an operational amplifier A1 in place of transistor M1, current sources I1 and I2, and diodes MD1 and MD2 of track-and-hold amplifier circuit 400. The buffering of the input signal, previously performed by transistor M1, current sources I1 and I2, and diodes MD1 and MD2 of track-and-hold amplifier circuit 400, is now performed by amplifier A1 by enclosing these elements within the feedback loop. The base of clamping transistor M4 is biased similar to that of clamping transistor M4 in track-and-hold-circuit 400.

Track-and-hold circuit 500 also includes two switching transistors M2a and M2b in place of switching transistor M2, which function similar to switching transistor M2. However, enclosing transistor M2a inside of the feedback loop of amplifier A1, provides a means to correct some of the errors made in the open loop circuit of track-and-hold circuit 400. In particular, the feedback loop acts to minimize the dc errors made in transistor M2b caused by Early Effect and the loading effects of transistor M5. In an alternate embodiment, a resistor Rd and a capacitor Cd, shown in FIG. 5 as dashed lines, are added to the emitter of transistor M2a to mimic the loading of resistor Rc and $C_H$ on transistor M2b. In this way, the dynamic loading effects of hold capacitor $C_H$ can be induced onto transistor M2a, the transistor in the feedback loop. Amplifier A1 then corrects for distortion of transistor M2a caused by the mimicked load comprised of resistor Rd and capacitor Cd. In this way, the feedback loop acts to predistort the signal at the base of transistors M2a, M2, which can lower the distortion caused by hold capacitor $C_H$.

Hold amplifier A2, shown as a simple closed-loop unity buffer, isolates hold capacitor $C_H$ node from output terminal 206. Hold amplifier A2 replaces transistor M3 and diode M3 of track-and-hold circuit 400 which together functioned as the hold amplifier and level shift. However, even though hold amplifier A2 is a unity buffer to the voltage across hold capacitor $C_H$, it is still desirable to level shift up one base-emitter voltage to compensate for the base-emitter voltage drop from clamping transistor M4. As a result, diode MD2 is still needed to provide level shifting. Thus, when switching transistors M2a, M2b are turned off, the voltage at the bases of transistors M2a and M2b will essentially equal the voltage across hold capacitor $C_H$. So, the base-emitter voltage of transistors M2a, M2b is at zero volts and zero volt bias state when these switching transistors M2a, M2b are cut-off.

The clamping and hold-mode isolation functions of track-and-hold amplifier circuit 500 are similar to those in track-and-hold amplifier circuit 400. However, simulations have determined that track-and-hold amplifier circuit 500 has approximately 4 dB less noise and 10–20 dB better distortion than track-and-hold amplifier circuit 400. In addition, the thermal settling dc offset performance of track-and-hold amplifier circuit 500 is also better than the open-loop configuration of track-and-hold amplifier circuit 400. However, the complexity of track-and-hold amplifier circuit 500 requires more acquisition time than track-and-hold amplifier circuit 400. For example, track-and-hold amplifier circuit 500 requires approximately 1–2 nanoseconds of additional time for processing.

Various other modifications and alterations in the structure and method of operation of this invention will be apparent to those skilled in the art without departing from the scope and spirit of this invention. Although the invention has been described in connection with specific preferred embodiments, it should be understood that the invention as claimed should not be unduly limited to such specific embodiments.

What is claimed is:

1. An apparatus including a track-and-hold circuit, the track-and-hold circuit comprising:

an input circuit for conveying an input signal;

a capacitor circuit for storing a voltage representative of the input signal;

a differential amplifier circuit configured to receive a track signal and in accordance therewith generate a first control signal, and configured to receive a hold signal and in accordance therewith generate a second control signal;

a switching circuit coupled between the input circuit and the capacitor circuit and coupled to the differential amplifier circuit and configured to receive the first and second control signals and in accordance therewith close and open;

a clamping circuit coupled to the switching circuit and the differential amplifier circuit, wherein the clamping circuit receives the second control signal and in accordance therewith clamps the voltage on the switching circuit to isolate the input signal from the voltage representative of the input signal stored on the capacitor circuit; and an output circuit coupled to the capacitor circuit and configured to receive a voltage appearing across the capacitor and in accordance therewith generate an output signal, wherein the output circuit comprises an output buffer circuit and a level shifter, such that the stored voltage appearing across the capacitor circuit is substantially equal to a voltage level of the input signal.

2. The apparatus of claim 1, wherein the output buffer circuit comprises a transistor and the level shifter comprises at least one diode.

3. An apparatus including a track-and-hold circuit, the track-and-hold circuit comprising:

an input circuit for conveying an input signal;

a capacitor circuit for storing a voltage representative of the input signal;

a differential amplifier circuit configured to receive a track signal and in accordance therewith generate a first control signal, and configured to receive a hold signal and in accordance therewith generate a second control signal;

a switching circuit coupled between the input circuit and the capacitor circuit and coupled to the differential amplifier circuit and configured to receive the first and second control signals and in accordance therewith close and open;

a clamping circuit coupled to the switching circuit and the differential amplifier circuit, wherein the clamping circuit receives the second control signal and in accordance therewith clamps the voltage on the switching circuit to isolate the input signal from the voltage representative of the input signal stored on the capacitor circuit; and an output circuit coupled to the capacitor circuit and configured to receive a voltage appearing across the capacitor and in accordance therewith generate an output signal, wherein the input circuit comprises an input buffer circuit and a level shifter and wherein the output circuit comprises an output buffer circuit and a level shifter, such that the stored voltage appearing across the capacitor circuit is substantially equal to a voltage level of the input signal.

4. An apparatus including a track-and-hold circuit, the track-and-hold circuit comprising:

an input circuit for conveying an input signal;

a capacitor circuit for storing a voltage representative of the input signal;

a differential amplifier circuit configured to receive a track signal and in accordance therewith generate a first control signal, and configured to receive a hold signal and in accordance therewith generate a second control signal;

a switching circuit coupled between the input circuit and the capacitor circuit and coupled to the differential amplifier circuit and configured to receive the first and second control signals and in accordance therewith close and open;

a clamping circuit coupled to the switching circuit and the differential amplifier circuit, wherein the clamping circuit receives the second control signal and in accordance therewith clamps the voltage on the switching circuit to isolate the input signal from the voltage representative of the input signal stored on the capacitor circuit; and an output circuit coupled to the capacitor circuit and configured to receive a voltage appearing across the capacitor and in accordance therewith generate an output signal, wherein the switching circuit comprises a transistor having a first base coupled to the input circuit and the differential amplifier circuit, a first emitter coupled to the capacitor circuit and a first collector coupled to a supply terminal, and wherein the clamping circuit comprises a second transistor having a second base coupled to a biasing circuit, a second emitter coupled to the first base of the first transistor, and a second collector coupled to the supply terminal.

5. An apparatus including a track-and-hold circuit, the track-and-hold circuit comprising:

an input circuit for conveying an input signal;

a capacitor circuit for storing a voltage representative of the input signal;

a differential amplifier circuit configured to receive a track signal and in accordance therewith generate a first control signal, and configured to receive a hold signal and in accordance therewith generate a second control signal;

a switching circuit coupled between the input circuit and the capacitor circuit and coupled to the differential amplifier circuit and configured to receive the first and second control signals and in accordance therewith close and open;

a clamping circuit coupled to the switching circuit and the differential amplifier circuit, wherein the clamping circuit receives the second control signal and in accordance therewith clamps the voltage on the switching circuit to isolate the input signal from the voltage representative of the input signal stored on the capacitor circuit; and an output circuit coupled to the capacitor circuit and configured to receive a voltage appearing across the capacitor and in accordance therewith generate an output signal, wherein the input circuit comprises an amplifier circuit having an input and an output, and having a feedback loop, wherein the clamping circuit couples to the output of the amplifier circuit, and wherein a portion of the switching circuit is within the feedback loop.

6. An apparatus including a track-and-hold circuit, the track-and-hold circuit comprising:

an input circuit for conveying an input signal;

a capacitor circuit for storing a voltage representative of the input signal;

a differential amplifier circuit configured to receive a track signal and in accordance therewith generate a first control signal, and configured to receive a hold signal and in accordance therewith generate a second control signal;

a switching circuit coupled between the input circuit and the capacitor circuit and coupled to the differential amplifier circuit and configured to receive the first and second control signals and in accordance therewith close and open;

a clamping circuit coupled to the switching circuit and the differential amplifier circuit, wherein the clamping circuit receives the second control signal and in accordance therewith clamps the voltage on the switching circuit to isolate the input signal from the voltage representative of the input signal stored on the capacitor circuit; and an output circuit coupled to the capacitor circuit and configured to receive a voltage appearing across the capacitor and in accordance therewith generate an output signal, wherein the input circuit comprises an input buffer circuit and a level shifter, such that the stored voltage appearing across the capacitor circuit is substantially equal to a voltage level of the input signal.

7. The apparatus of claim 6, wherein the input buffer circuit comprises a transistor and the level shifter comprises at least one diode.

8. An apparatus including a track-and-hold circuit, the track-and-hold circuit comprising:

an input circuit for conveying an input signal;

a capacitor circuit for storing a voltage representative of the input signal;

a differential amplifier circuit configured to receive a track signal and in accordance therewith generate a first control signal, and configured to receive a hold signal and in accordance therewith generate a second control signal;

a switching circuit coupled between the input circuit and the capacitor circuit and coupled to the differential amplifier circuit and configured to receive the first and second control signals and in accordance therewith close and open;

a clamping circuit coupled to the switching circuit, the output circuit, and the differential amplifier circuit, wherein the clamping circuit receives the second control signal and in accordance therewith clamps the voltage on the switching circuit to isolate the input signal from the voltage representative of the input signal stored on the capacitor circuit; and an output circuit coupled to the capacitor circuit and configured to receive a voltage appearing across the capacitor and in accordance therewith generate an output signal, wherein the switching circuit comprises a plurality of transistors.

9. An apparatus including a track-and-hold circuit, the track-and-hold circuit comprising:

an input circuit for conveying an input signal;

a capacitor circuit for storing a voltage representative of this input signal;

a differential amplifier circuit configured to receive a track signal and in accordance therewith generate a first control signal, and configured to receive a hold signal and in accordance therewith generate a second control signal;

a switching circuit coupled between the input circuit and the capacitor circuit and coupled to the differential amplifier circuit and configured to receive the first and second control signals and in accordance therewith close and open;

a clamping circuit coupled to the switching circuit and the differential amplifier circuit, wherein the clamping circuit receives the second control signal and in accordance therewith clamps the voltage on the switching circuit to isolate the input signal from the voltage representative of the input signal stored on the capacitor circuit; and an output circuit coupled to the capacitor circuit and configured to receive a voltage appearing across the capacitor and in accordance therewith generate an output signal, wherein the output circuit comprises an amplifier circuit having an input and an output, and having a feedback loop, wherein the capacitor circuit couples to the input of the amplifier circuit and the clamping circuit couples to the output of the amplifier circuit.

10. The apparatus of claim 9, wherein the switching circuit comprises a first transistor within the feedback loop and a second transistor outside the feedback loop.

11. The apparatus of claim 10, further comprising:

a resistive circuit coupled between the second transistor and the capacitor circuit;

a load circuit coupled to the input of the amplifier circuit and to the first transistor, wherein the load circuit mimics a load coupled to the second transistor comprising the resistive circuit and the capacitor circuit.

12. An apparatus including a track-and-hold circuit, the track-and-hold circuit comprising:

an input circuit for conveying an input signal, the input circuit including an input buffer circuit and a first level shifter;

an output circuit for conveying an output signal, the output circuit having an output buffer circuit and a second level shifter;

a differential amplifier having first and second inputs, and first and second outputs;

a clamping circuit comprising a clamping transistor having an emitter coupled to the input circuit and to the first output of the differential amplifier, a base coupled to the output circuit, and a collector coupled to a first supply terminal;

a switching circuit comprising a switching transistor having an emitter coupled to the second output of the differential amplifier, a base coupled to the input circuit, and a collector coupled to the first supply terminal; and a capacitor circuit coupled to the emitter of the switching transistor and a second supply terminal.

13. The apparatus of claim 12, wherein the track and hold circuit further comprises a resistive circuit coupled between the emitter of the switching transistor and the capacitor circuit.

14. The apparatus of claim 12, wherein the input circuit further includes an amplifier circuit having an input, an output, and a feedback loop, wherein the clamping circuit couples to the output of the amplifier circuit, and wherein a portion of the switching circuit is within the feedback loop.

15. The apparatus of claim 12, wherein the switching circuit comprises a plurality of transistors.

16. The apparatus of claim 12, wherein the output circuit further includes an amplifier circuit having an input, an output, and a feedback loop, wherein the capacitor circuit couples to the input of the amplifier circuit, and the clamping circuit couples to the output of the amplifier circuit.

17. The apparatus of claim 16, wherein the switching circuit further comprises a second transistor, wherein the switching transistor is outside the feedback loop and the second transistor is within the feedback loop.

* * * * *